United States Patent [19]

Hirakawa et al.

[11] Patent Number: 5,151,118
[45] Date of Patent: Sep. 29, 1992

[54] METHOD FOR PRODUCING A PACKAGE-TYPE SEMICONDUCTOR ASSEMBLY

[75] Inventors: Tadao Hirakawa; Sachio Tamura, both of Yokohama; Hiromitsu Sasanami, Kawasaki, all of Japan

[73] Assignee: Kabushiki Kaisha Goto Seisakusho, Yokohama, Japan

[21] Appl. No.: 769,770

[22] Filed: Oct. 4, 1991

Related U.S. Application Data

[63] Continuation of Ser. No. 458,355, Dec. 28, 1989, abandoned, which is a continuation-in-part of Ser. No. 286,724, Dec. 20, 1988, abandoned.

[30] Foreign Application Priority Data

Jul. 8, 1988 [JP] Japan ................................ 63-168940

[51] Int. Cl.⁵ .............................................. C03B 19/09
[52] U.S. Cl. ...................................... 65/18.1; 65/18.3; 65/18.4; 65/59.4; 65/59.5; 65/139; 65/140; 65/144; 53/140; 357/73
[58] Field of Search .................. 65/18.1, 18.3, 18.4, 65/59.4, 59.5, 139, 140, 144; 357/73; 53/140

[56] References Cited

U.S. PATENT DOCUMENTS

| | | | |
|---|---|---|---|
| 3,340,347 | 9/1967 | Spiegler | 174/52 |
| 3,924,246 | 12/1975 | Scherer | 340/173 SP |
| 3,996,602 | 12/1976 | Goldberg et al. | 357/73 |
| 4,058,821 | 11/1977 | Miyoshi et al. | 357/73 |
| 4,168,960 | 9/1979 | Yoldas | 357/73 |

FOREIGN PATENT DOCUMENTS 57-89262 6/1982 Japan .
57-90964 6/1982 Japan .

Primary Examiner—Robert L. Lindsay
Attorney, Agent, or Firm—Fleit, Jacobson, Cohn, Price, Holman & Stern

[57] ABSTRACT

In production of a closed package-type semiconductor assembly provided with a built-in semiconductor element and conductive leads for connection to outside devices, a conductive island, the conductive leads and other accessories are united together by one stage moulding of molten glass. Simple process reduces the production cost greatly and no use of dusty ceramic components much raises functional reliability of the product.

4 Claims, 2 Drawing Sheets

METHOD FOR PRODUCING A PACKAGE-TYPE SEMICONDUCTOR ASSEMBLY

This application is a continuation of application Ser. No. 07/458,355, filed Dec. 28, 1989, which is a continuation-in-part of application Ser. No. 07/286,724 filed Dec. 20, 1988 both now abandoned.

BACKGROUND OF THE INVENTION

The present invention relates to a method for producing a package-type semiconductor assembly, and more particularly relates to an improvement in the production of a package casing for a semiconductor assembly in which one or more semiconductor elements are built in a closed package in electric connection to outside devices via conductive leads extending through the walls of the package.

In one typical example of a semiconductor assembly equipped with IC chips, LSI chips, photoelectric elements or crystal oscillators, islands and inner leads mounted on a ceramic base are overlaid with a ceramic ring and low melting point glass is used for bonding the ceramic ring to the parts on the ceramic base.

In the case of such a conventional semiconductor assembly, the price of the product is much swayed by use of expensive ceramics for the base and the ring. Since the ceramic parts are prepared by cutting and polishing, the parts are in most cases inevitably accompanied with much powdery dust. Presence of such powdery dust often wields malign influence on the electric characteristics of the device, thereby lowering the functional reliability of the product.

In an attempt to remove such disadvantages resulted from use of ceramics, a U.S. Pat. No. 3,340,347 to Spiegler proposed production of a closed package-type semiconductor assembly. In the process of this earlier patent, a metallic coating of an electroconductive material is applied to on surface of a flat dielectric substrate, predetermined portions of the metallic coating are removed to form contact plates and conductive leads are disposed in contact with the contact plates in a manner so that they extend beyond the edges of the substrate. A glass ring is disposed about the periphery of the substrate in contact with the conductive leads and extends over the bond between the conductive leads and the contact plates. The glass ring is then fused to the substrate to form an enclosure body.

In fact, this proposed method well removed the disadvantages resulted from use of ceramics. Despite such advantages, however, the method is accompanied with other disadvantages. For fusion of the glass ring to the substrate, temperature must be controlled carefully so as to melt the glass only without any influence on the substrate. Moulds need to be used to keep the shape of the glass ring during the fusion process. Further, since the conductive leads cannot be bonded directly to the substrate, a metallic coating must be additionally formed on the surface of the substrate. Production cost is raised due to the multi-staged production process and delicate temperature control.

SUMMARY OF THE INVENTION

It is the primary object of the present invention to provide a low cost method for production of a package-type semiconductor assembly without any use of ceramics.

It is another object of the present invention to enable production of a semiconductor assembly free of dust problems.

In accordance with the basic concept of the present invention, one or more conductive leads are clamped between a pair of moulds each having a cavity, plungers are inserted into the cavities one in contact with and the other somewhat spaced from the conductive leads clamped, one or more conductive island are placed in the cavities near the conductive leads, powdery glass is partly filled into spaces left in the cavities, the other plunger is further inserted into the associated cavity after heat melting of the powdery glass so as to fully fill the spaces with molten glass and the molten glass is cooled for solidification.

DESCRIPTION OF THE PREFERRED EMBODIMENTS

Figure 1:
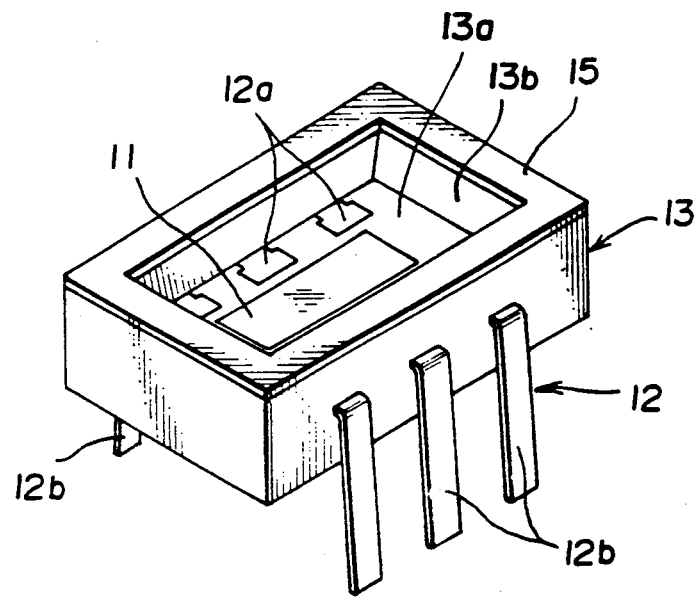
FIG. 1 is a perspective view of one example of the package casing for a semiconductor assembly produced by the method in accordance with the present invention.
Figure 2:
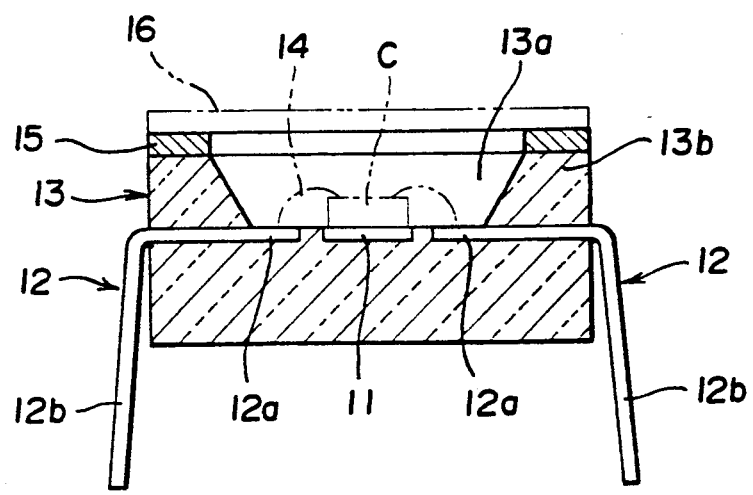
FIG. 2 is a sectional side view of the semiconductor assembly shown in FIG. 1 and FIGS. 3A and 3B are sectional side views of sequential operational steps of the method in accordance with the present invention.

One example of a package casing for a semiconductor assembly produced by the method in accordance with the present invention is shown in FIG. 1, in which the assembly includes a package casing 13 provided with a center recess 13a for accommodation of a semiconductor element C such as an IC chip, a photoelectric element or a crystal oscillator. The center recess 13 is surrounded by four side walls 13b. Several conductive leads 12 project outside the casing 13 passing through the walls 13b. Each conductive lead 12 is made up of an inner lead section 12a and an outer lead section 12b and the conductive lead 12 is bent about 90 degrees at the border between the two lead sections 12a and 12b. The inner lead section 12a extends into the center recess 13a and its top surface is exposed out of the bottom of the center recess 13a for contact with the semiconductor element C placed on the bottom of the center recess 13a. The outer lead section 12b extends downwards. A conductive semiconductor element C is embedded in the bottom of the center recess 13a just beneath the semiconductor element C. The island 11 is connected to the inner lead sections 12a by means of conductive wires 14 as shown with phantom lines in FIG. 2.

Depending on need in use, a metallic ring 15 made of iron or kovar maybe attached to the package casing 13. In this case, the metallic ring 15 is fixed atop the walls 13b of the casing. Further, a metallic cover 16 may additionally be fixed atop the metallic ring 15 by welding.

Next, one embodiment of the method in accordance with the present invention will be explained in reference to FIGS. 3A and 3B.

In the first place one or more conductive lead 12 are prepared. At this stage of production, the conductive lead 12 is still straight in shape and made up of an inner lead section 12a and an outer lead section 12b. The first mould 20 is provided with a cavity 21 open in both end surfaces and the second mould 30 is also provided with a cavity 31 open in both end surfaces. The first plunger 40 has a configuration which allows tight insertion thereof into the cavity 21 in the first mould 20. Whereas the second plunger 50 has a configuration which allows tight insertion into the cavity 31 in the second mould 30 whilst leaving a space S2 which corresponds in shape to the walls 13b of the package casing 13 shown in FIG. 1.

Figure 3:
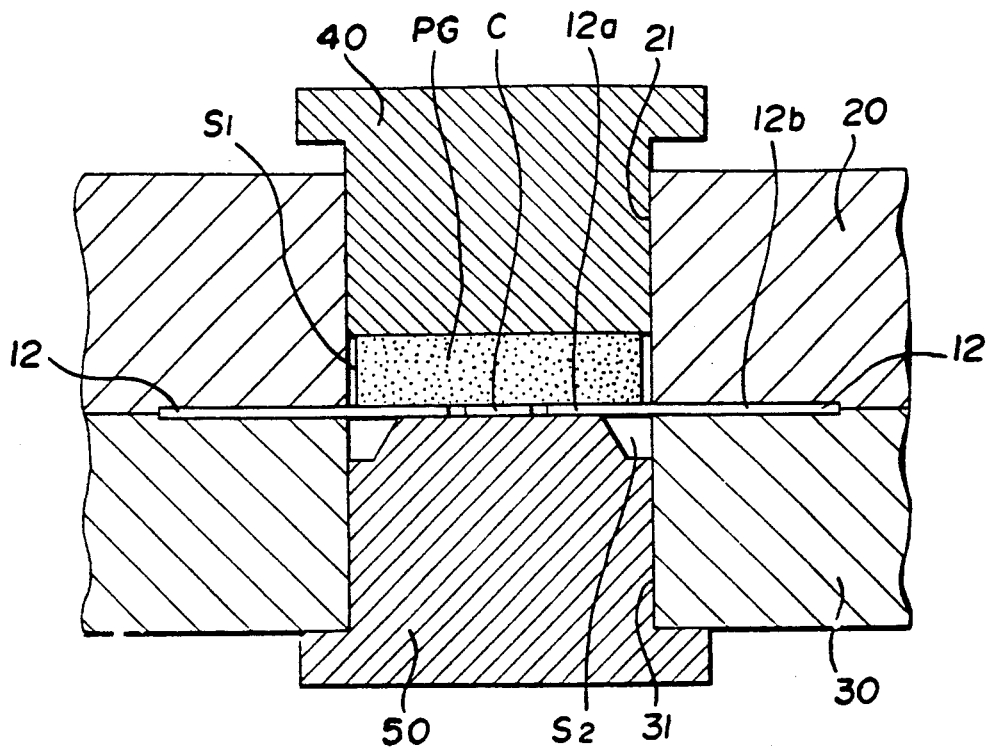
Figure 3:
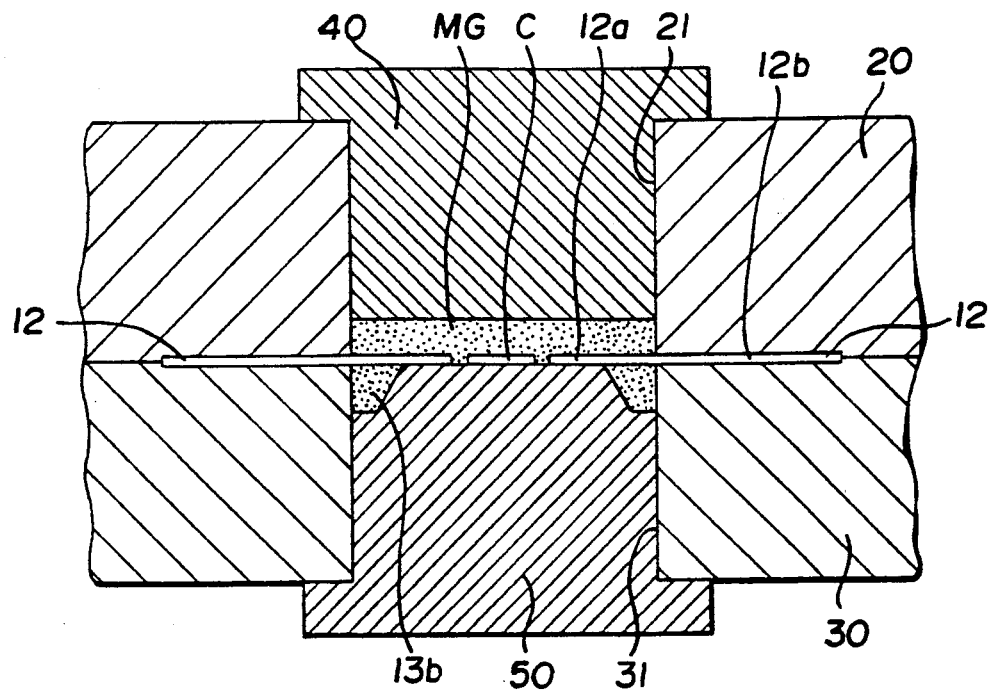

The first and second moulds 20 and 30 are combined together as shown in FIG. 3A in a manner such that the conductive leads 12 are clamped between the the two moulds. More specifically in this state, the outer lead section 12b of each conductive lead 12 is clamped between the mating end surfaces of the two moulds but the inner lead section 12a is exposed in the cavities 21 and 31. The first plunger 40 is inserted into the cavity 21 of the first mould 20 to a position spaced from the inner lead sections 12a of the conductive leads 12 whilst leaving a space S1. The second plunger 50 is also inserted into the cavity 31 of the second mould 30 until it contacts the inner lead sections 12a of the conductive leads 12. In this state, the space S2 is left in the cavity 31 which corresponds in shape to the walls 13b of the package casing 13 shown in FIG. 1. Next, the conductive island 11 is placed in the space S1 near the inner lead sections 12a of the conductive leads 12.

After necessary components are all placed in the space S1, the spaces left in the cavities 21 and 31 are partly filled with powdery glass PG. In this case, the words "powdery glass" refers to glass in the form of powder, glass in the form of fine particles and glass in the form of incompletely sintered small pieces. After filling the powdery glass is molten by application of heat. Then the first plunger 40 is force moved in the cavity 21 to a position closer to the inner lead sections 12a of the conductive lead 12 whilst leaving the space S1 which now corresponds in shape to the bottom section of the package casing 13 connecting the walls 13b. By this forced movement of the first plunger 40 the molten glass MG fully fills the spaces S1 and S2 in the cavities 21 and 31. Finally the molten glass is solidified by cooling.

The semiconductor package casing assembly thus produced includes the island 11, the conductive lead 12 united together by the package casing 13 while the inner lead sections 13a of the conductive leads 12 are exposed in the center recess 13a in the package casing 13.

In accordance with the present invention, a package casing for a closed package-type semiconductor assembly can be produced only by one stage moulding, thereby greatly simplifying the operation and reducing the production cost. The product is quite free of the problem of dust which is otherwise generated by cutting and polishing.

We claim:

1. A method for producing a package casing for a package-type semiconductor assembly comprising the steps of:
   providing at least one straight conductive lead having inner and outer lead sections and first and second lead surfaces;
   providing a first mold having first and second end surfaces and a cavity open in the first and second end surfaces;
   providing a second mold having first and second end surfaces and a cavity open in the first and second end surfaces of said second mold;
   combining said first and second molds together in a manner such that said at least one conductive lead is clamped between said first surfaces of said first and second molds with said inner lead section being exposed in said cavities of said first and second molds and said first lead surface facing said cavity in said first mold and said second lead surface facing said cavity in said second mold;
   inserting a first plunger into said cavity in said first mold to a first position spaced from said first lead surface of said inner lead section of said at least one conductive lead to provide an upper space;
   inserting a second plunger into said cavity in said second mold to a position in contact with said second lead surface of said inner lead section of said at last one conductive lead;
   providing a lower space between said second mold, said second plunger, and a portion of said second lead surface of said at least one lead adjacent said second end surface of said second mold;
   placing at least one conductive island in said cavities in adjacent spaced relation to said inner lead section of said at least one conductive lead;
   partly filling glass powder into said upper and lower spaces in said cavities of said first and second molds;
   melting said glass powder by application of heat;
   forcibly moving said first plunger in said cavity in said first mold to a second position closer to but spaced from said first surface of said inner lead section of said at least one conductive lead so that molten glass completely fills said spaces in said cavities; and
   solidifying said molten glass by cooling to integrate said inner lead section of said at least one conductive lead and said conductive island in adjacent spaced relation in a unitary glass body.

2. A method for producing a package casing for a package-type semiconductor assembly comprising the steps of:
   providing at least one straight conductive lead having inner and outer lead sections and first and second lead surfaces;
   providing a first mold having first and second end surfaces and a cavity open in the first and second end surfaces;
   providing a second mold having first and second end surfaces and a cavity open in the first and second end surfaces of said second mold;
   combining said first and second molds together in a manner such that said at least one conductive lead is clamped between said first surfaces of said first and second molds with said inner lead section being exposed in said cavities of said first and second molds and said first surface facing said cavity in said first mold and said second lead surface facing said cavity in said second mold;
   inserting a first plunger into said cavity in said first mold to a first position spaced from said first lead surface of said inner lead section of said at least one conductive lead to provide an upper space;
   inserting a second plunger into said cavity in said second mold to a position in contact with said second lead surface of said inner lead section of said at last one conductive lead;
   providing a lower space between said second mold, said second plunger, and a portion of said second lead surface of said at least one lead adjacent said second end surface of said second mold;

partly filling glass powder into said upper and lower spaces in said cavities of said first and second molds;

melting said glass powder by application of heat;

forcibly moving said first plunger in said cavity in said first mold to a second position closer to but spaced from said first surface of said inner lead section of said at least one conductive lead so that molten glass completely fills said spaces in said cavities; and solidifying said molten glass by cooling to integrate said inner lead section of said at least one conductive lead in a unitary glass body.

3. A method as claimed in claim 1 wherein:
said glass powder is in the form of fine particles.

4. A method as claimed in claim 1 wherein:
said glass powder is in the form of incompletely sintered small pieces.

* * * * *

UNITED STATES PATENT AND TRADEMARK OFFICE
CERTIFICATE OF CORRECTION

PATENT NO. : 5,151,118

DATED : September 29, 1992

INVENTOR(S) : Tadao Hirakawa, Sachio Tamura and Hiromitsu Sasanami

It is certified that error appears in the above-identified patent and that said Letters Patent is hereby corrected as shown below:

Col. 1, line 66, before "package" insert --package casing for a--.

Col. 2, line 48, change "semiconductor element C" to --island 11--.

Col. 2, line 50, change "island 11" to --semiconductor element C--.

IN THE DRAWINGS:

In Figs. 3(A) and 3(B) and in the figure on the first page of the patent, the identifying letter "C" should be changed to the number --11--.

Signed and Sealed this

Twenty-sixth Day of October, 1993

Attest:

BRUCE LEHMAN

Attesting Officer

Commissioner of Patents and Trademarks